United States Patent
Rombach

(10) Patent No.: US 10,237,638 B2
(45) Date of Patent: Mar. 19, 2019

(54) ELECTRIC DEVICE, IN PARTICULAR A MICROPHONE HAVING RE-ADJUSTABLE SENSITIVITY, AND ADJUSTMENT METHOD

(71) Applicant: Epcos AG, München (DE)

(72) Inventor: Pirmin Hermann Otto Rombach, Kongens Lyngby (DK)

(73) Assignee: TDK Corporation, Tokyo (JP)

( * ) Notice: Subject to any disclaimer, the term of this patent is extended or adjusted under 35 U.S.C. 154(b) by 8 days.

(21) Appl. No.: 15/126,111

(22) PCT Filed: Feb. 18, 2015

(86) PCT No.: PCT/EP2015/053422
§ 371 (c)(1),
(2) Date: Sep. 14, 2016

(87) PCT Pub. No.: WO2015/149985
PCT Pub. Date: Oct. 8, 2015

(65) Prior Publication Data
US 2017/0099535 A1  Apr. 6, 2017

(30) Foreign Application Priority Data

Apr. 3, 2014  (DE) .................. 10 2014 104 773

(51) Int. Cl.
*H04R 1/04* (2006.01)
*B81B 7/00* (2006.01)
(Continued)

(52) U.S. Cl.
CPC ............... *H04R 1/04* (2013.01); *B81B 7/008* (2013.01); *B81C 1/0023* (2013.01);
(Continued)

(58) Field of Classification Search
CPC ...... B81B 2201/0257; B81B 2207/012; B81B 7/008; B81C 1/0023; B81C 2203/035;
(Continued)

(56) References Cited

U.S. PATENT DOCUMENTS

| | | | |
|---|---|---|---|
| 8,036,401 B2 * | 10/2011 | Poulsen | H04R 19/005 381/111 |
| 2008/0075306 A1 | 3/2008 | Poulsen et al. | |
| 2010/0166228 A1 | 7/2010 | Steele et al. | |
| 2011/0142261 A1 | 6/2011 | Josefsson | |
| 2013/0032905 A1 * | 2/2013 | Lo | B81B 7/007 257/416 |
| 2013/0277776 A1 | 10/2013 | Herzum et al. | |

FOREIGN PATENT DOCUMENTS

| EP | 2252077 A1 | 11/2010 |
|---|---|---|
| WO | 2008116039 A2 | 9/2008 |

(Continued)

OTHER PUBLICATIONS

Brauche Hilfe bei Hartpapier-Lochrasterplatine ohne Kupfer; retrieved on May 21, 2015, from <http://www.mikrocontroller.net/attachment/109974/Lochraster-8085-Loetseite.jpg> (1 page).
(Continued)

*Primary Examiner* — Duc Nguyen
*Assistant Examiner* — Kile Blair
(74) *Attorney, Agent, or Firm* — Nixon Peabody LLP

(57) ABSTRACT

In order to adjust an electric device, it is proposed to integrate a programmable memory unit into the device and to address said programmable memory unit without enlarging the footprint, via contact areas that are obtained by dividing previous contact areas. In this case, an adjustment value in particular for compensating for a fault tolerance is fed into the memory unit, an operating parameter being readjusted with the aid of said adjustment value. In each case two divided contact areas are short-circuited via a common soldering location during the mounting of the device.

12 Claims, 1 Drawing Sheet

Figure 1:
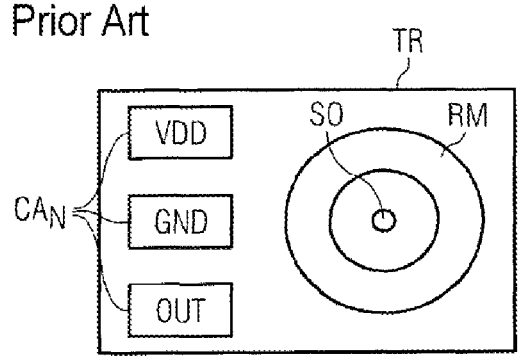

(51) Int. Cl.
    *B81C 1/00*     (2006.01)
    *B81C 99/00*     (2010.01)
    *H04R 19/04*     (2006.01)

(52) U.S. Cl.
    CPC ............ *B81C 99/003* (2013.01); *H04R 19/04* (2013.01); *B81B 2201/0257* (2013.01); *B81B 2207/012* (2013.01); *B81B 2207/07* (2013.01); *B81C 2203/035* (2013.01); *H01L 2224/16225* (2013.01); *H01L 2924/15311* (2013.01); *H04R 2201/003* (2013.01)

(58) Field of Classification Search
    CPC ........ B81C 99/003; H04R 19/04; H04R 1/04; H04R 2201/003
    See application file for complete search history.

(56) References Cited

FOREIGN PATENT DOCUMENTS

| WO | 2011134166 A1 | 11/2011 |
| WO | 2015149985 A1 | 10/2015 |

OTHER PUBLICATIONS

International Search Report and Written Opinion of International Searching Authority for PCT/EP2015/053422, dated Aug. 27, 2015, with English translations of both (28 pages).
International Preliminary Report on Patentability of International Application No. PCT/EP2015/053422, dated Oct. 13, 2016, with English translation (12 pages).

\* cited by examiner

ELECTRIC DEVICE, IN PARTICULAR A MICROPHONE HAVING RE-ADJUSTABLE SENSITIVITY, AND ADJUSTMENT METHOD

CROSS-REFERENCE TO RELATED APPLICATIONS

This application is a U.S. National Stage of International Application No. PCT/EP2015/053422, filed on Feb. 18, 2015, entitled "Electric Component, In Particular A Microphone Having Re-Adjustable Sensitivity, And Adjustment Method" which claims the benefit of Germany Patent Application No. 10 2014 104 773.7, filed on Apr. 3, 2014, both of which are incorporated herein by reference in their entireties.

The sensitivity of MEMS microphones is concomitantly determined by the construction and the suspension of the membrane. On account of the small layer thickness and the complicated suspension of the membrane, during the production thereof manufacturing fluctuations occur which lead to corresponding fluctuations in the sensitivity of the microphones. A typical tolerance is in the range of +/−3 dB re V/Pa. For demanding applications of a microphone this is an excessively high value, however, such that microphones for these applications have to be individually measured and selected according to their sensitivity. Stringent requirements are demanded for example in the case of so-called beam forming or in arrangements for noise reduction. In that case, two or more microphones or the output signals thereof are compared and processed, such that an excessively high sensitivity fluctuation leads to corrupted results.

However, a lower tolerance is desirable for normal mobile handsets as well, since that increases the total fluctuation range of the sensitivity over the entire acoustic path by virtue of the fluctuations adding up to values of +/−5 to +/−6 dB. For example, sensitivity fluctuations of +/−1 dB re V/pa would be desirable.

One possibility for readjusting a microphone having a sensitivity deviating from a target value consists in integrating into the microphone or into the ASIC of the microphone an OTP component (OTP=one time programmable), in which an adjustment value for subsequent correction can then be stored later. Such an adjustment value is ascertained by a procedure in which, in the case of a finished produced microphone, the operating parameters thereof are tested and an adjustment value is ascertained from the deviations and subsequently stored in the OTP component. The bias voltage applied to the microphone or the amplifier can be regulated with the aid of said adjustment value.

For inputting the adjustment value into the OTP component of an analog microphone, two additional contact areas (pads) are required, namely a contact area for a clock signal CLK and a contact area for a write/read access W/R (W/R=Write/Read). Contact areas for ground (GND), supply voltage (VDD) and signal output (OUT) already exist as connections required for the normal operation of the microphone. The first two connections thereof can be concomitantly used for programming the OTP component.

In conventional miniaturized MEMS microphones the underside of the device is occupied densely by contact areas. In addition, the sound opening and a sealing ring around it, e.g. a ring-shaped metallization around the sound opening, can also be provided on the underside. Two additional connection areas for driving the OTP component would necessitate a not inconsiderable enlargement of the microphone.

Circuitry measures that would allow a multiple utilization of the existing contact areas as an alternative to additional contact areas make stringent requirements of the design of the ASIC, however, and in the worst case lead to a deterioration of the microphone properties. In digital microphones inherently comprising a plurality of connection areas, the problem for driving OTP components is negligible.

Therefore, it is an object of the present invention to provide a solution to the problem mentioned above and to specify in particular an electric device in which an OTP component can be integrated, but which does not require an increased basic area in comparison with known devices. In particular, the intention is to specify an adjustable electric device.

This object is achieved according to the invention by means of a device having the features of claim 1. Advantageous configurations of the invention and also a method for adjusting devices can be gathered from further claims.

An electric device is specified which has a conventional footprint for incorporation e.g. by means of soldering into a circuit environment. Said footprint comprises as before a given number of grid areas on the surface, in which are arranged contact areas intended for the connection of the device to the circuit environment. In this case, a grid area is the unit of area which is arranged in the grid and generally corresponds to the area which is required for a soldering location of the respective device or which is generally chosen for the respective device. The grid can be a customized or technology-specific solder grid and correspond to a specific specification with regard to size and spacing of the soldering locations.

In one embodiment, all the grid areas are of identical size and the grid is regular. The grid can, but need not, have identical spacings between the grid areas.

In order to provide additional contact possibilities for driving an OTP component, at least one of the contact areas is split. This means that despite the footprint for the device itself remaining the same, one of the conventional contact areas is replaced by two smaller or smaller-area contact areas, which together do not have more basic area than one conventional contact area. The two smaller contact areas fill the corresponding grid area and together form a solderable metallization for a later soldering location. The conventional contact areas likewise fill the corresponding grid area. The device thus comprises as before a number of soldering locations, or locations provided for later soldering locations, which corresponds to the number of grid areas.

If a conventional footprint has for example a grid of three conventional contact areas and one of these conventional contact areas is then split according to the invention, four contact areas are available. If two conventional contact areas are split, in this case a total of five contact areas are available. Since a split contact area, that is to say two smaller-area contact areas, occupy a soldering location or together define a soldering location, they are short-circuited via the solder and the mating contact in the soldered state.

The driving of a programmable memory unit which is present in the device according to the invention and is designed as an OTP component, for example, is accomplished in a phase before the soldering of the device. For this purpose, the contact areas are connected for example via a point contact to a programming apparatus, by which data can then be input into the programmable memory unit.

Such a device has the advantage that the footprint is unchanged and no adaptation to a new housing size or to a different footprint is required on the part of the user. The basic area of the device is thus not enlarged either, said device already being present in a miniaturized form, i.e. a form equipped with a minimal basic area.

The abovementioned footprint is arranged on the first surface of a carrier and comprises a grid having a number of grid areas required for the proper function of the device, a respective soldering location being assigned to said grid areas. An electromechanical component and an integrated circuit are arranged on the opposite surface of the carrier and/or in a manner integrated into the carrier.

Furthermore, the device comprises the abovementioned programmable memory unit, for example an OTP component. The latter can be embodied as a separate component or be a part of the integrated circuit.

The electromechanical component and the integrated circuit are electrically conductively connected to one another and to the contact areas. The contact areas arranged in the grid areas are configured such that a soldering location completely fills a respective grid area. At least two of the contact areas are embodied with a smaller area than the other contact areas and share a grid area. After soldering, these smaller-area contact areas are short-circuited via the soldering location.

Dividing the larger-area contact areas into in each case two smaller contact areas makes it possible in each case to provide an additional contact area that can be used for the one-time programming of the device. The further small-area contact area produced by the splitting serves for the proper function of the device and, as heretofore, is electrically conductively connected to corresponding components of the device.

The additional small-area contact area and the further contact area serving for an existing device function are combined within the same grid area such that upon the short circuit via the common soldering location an influencing of the programmable memory unit is impossible and the operation of the device also remains undisturbed.

In one advantageous configuration, the device is embodied as a microphone that supplies an analog or digital output signal. The integrated circuit that is part of the device regulates the operating sequences and the sensitivity of the microphone and also the strength of the output signal. An adjustment value for the microphone can then be stored by means of the programmable memory unit. The programmable memory unit then makes said adjustment value available to the integrated circuit, in order to adapt a desired operating parameter in accordance with the adjustment value. Said operating parameter may be the sensitivity, the transfer characteristic, the signal-to-noise ratio, the maximum sound pressure loading at which the microphone has a certain total harmonic distortion, or else an operating mode, in order to optimize the microphone for a desired use possibility.

A known device embodied as an analog microphone comprises exactly three grid areas and thus three soldering locations on the first surface of the carrier. The proper operation of the device is possible via these three soldering locations.

In accordance with one embodiment of the invention, in such a microphone in each case one of the soldering locations is provided with a contact area for ground, for supply voltage and for signal output of the device. The two grid areas having the contact areas for ground and supply voltage are split in this case and the contact areas are therefore embodied with smaller area. They share the grid area with in each case a smaller-area contact area for the input of a clock signal and a program signal input. The two additional contact areas are connected to the programmable memory unit.

After the soldering of the device, the split contact areas are connected via the soldering location, such that the contact areas for supply voltage and program signal input are also connected, and additionally also the contact areas for ground and clock signal. Since the contact area for the clock signal is short-circuited via the ground contact area and a constant supply voltage is present at the program signal input, during the operation of the device it is not possible for the programmable memory unit to be overwritten by operation-dictated parameters or by the voltages and signals present during operation.

In one embodiment of the invention, the programmable memory unit is embodied as a flash memory. Such a memory can be written to with a sufficiently high signal level and then at lower voltages constitutes a ROM memory (Read Only Memory) in which the adjustment value can be stored. However, the programmable memory unit can also be embodied using other technologies that can be used for the use of OTP components. By way of example, PLAs (Programmable Logic Array), FPGAs (Field Programmable Gate Array) or else microcontrollers are possible. If the programmable memory unit is an OTP component, this has the advantage that the programmed or stored value cannot readily be changed, such that an unintentional change is precluded.

A method, likewise according to the invention, for adjusting an operating parameter in a device comprising an electromechanical component and a control circuit comprises the following steps:

Finished produced devices are prepared, for example a series of devices from a production batch.

For each individual device, at least one operating parameter is then determined.

Afterward, the determined parameter is compared with a predefined setpoint value or a predefined setpoint value range.

If a deviation is identified, a corresponding adjustment value for readjusting this deviating operating parameter is ascertained and assigned to the respective deviating device.

Afterward, the ascertained adjustment value of the device having a deviating operating parameter is input into the programmable memory unit thereof and stored there. The contact areas of the device are utilized for inputting the adjustment value.

The control circuit, which regulates or controls the proper operation of the device, can then access this adjustment value within the programmable circuit and thus adapt the operating parameter again to the setpoint value or the setpoint value range. In this way it is possible, in a series of devices having operating parameters deviating extensively from one another, to readjust said operating parameters for each device individually to a desired setpoint value or setpoint value range, wherein devices having only a narrow tolerance are obtained as a result.

The programmable memory unit is a long-term memory that stores the adjustment value, once the latter has been input, even without additional energy supply, such that the device has the desired operating parameter even without energy supply. After the adjustment value has been input, the device can therefore be stored for an arbitrary time before it is incorporated into a circuit environment in order to commence its proper operation there.

In order to incorporate the device into a circuit environment, at least one contact area used for the input is short-circuited with another contact area via the soldering location, such that a further programming is no longer possible after the soldering.

Since the contact areas required for the proper operation of the device are distributed over the grid areas such that each can be addressed even after the soldering, proper operation is possible without any interference. The contact areas which were utilized for programming or for inputting the adjustment value into the programmable memory unit are no longer addressable, since they are short-circuited with other small-area contact areas.

In one preferred method, the soldering locations for the device are arranged in a uniform grid and all are of approximately identical size. Each soldering location here preferably completely fills a grid area. In each case two of the contact areas have a basic area that is smaller than the respective grid area, and share a soldering location.

In one embodiment, the electromechanical component is an analog miniaturized microphone with integrated amplifier and has a membrane that is part of a capacitor. Here the method according to the invention and the associated device according to the invention enable the readjustment of the sensitivity of the microphone. The ascertained adjustment value is determined such that with its aid either the gain of the output signal output by the microphone or alternatively a bias voltage applied to the capacitor is varied in order to adjust the sensitivity to the setpoint value or the setpoint value range.

In a further embodiment, the electromechanical component is embodied as a digital miniaturized microphone.

The invention is explained in greater detail below on the basis of exemplary embodiments and the associated figures. The figures have been drawn up merely schematically and not in a manner true to scale, and so neither absolute nor relative dimensional indications can be inferred from them. Identical or identically acting parts are designated by identical reference signs.

Figure 2:
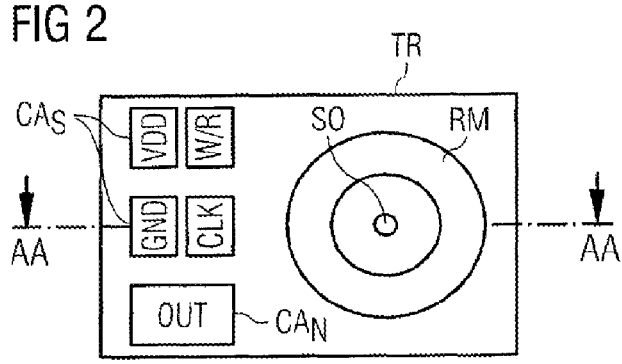
Figure 3:
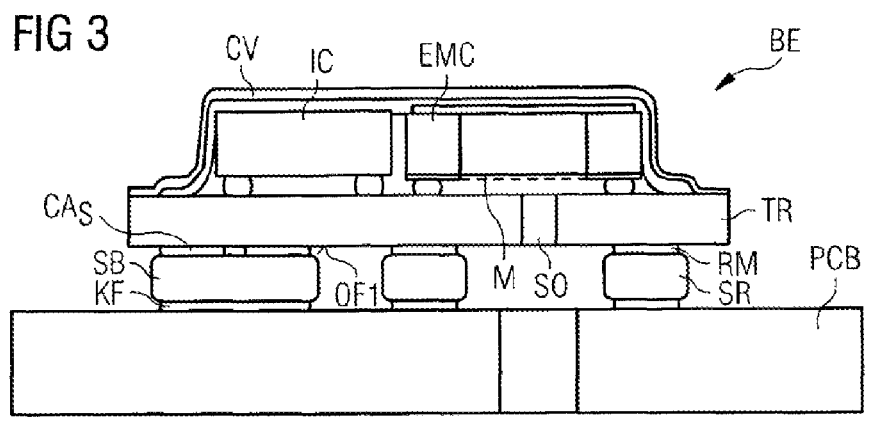

FIG. 1 shows a plan view of the underside of a microphone comprising the contact areas in the prior art, FIG. 2 shows the same plan view for a microphone according to the invention, FIG. 3 shows a schematic cross section through a microphone according to the invention mounted on a circuit carrier.

An analog MEMS microphone is mounted on a carrier TR comprising, on a first surface, designated hereinafter as the underside, three contact areas $CA_N$ of identical size that are arranged in a regular grid. A first contact area VDD serves for supply with a supply voltage, a second contact area GND is provided for the ground connection and a third contact area OUT is intended for the output signal of the microphone.

A sound opening SO toward the electroacoustic transducer, in particular toward an MEMS capacitor microphone, is likewise arranged on the underside of the carrier TR.

At a distance from the contact areas $CA_N$, a ring-shaped metallization RM is arranged on the underside and is intended for soldering with a likewise ring-shaped connection area on a circuit carrier in order thus to seal the acoustic channel.

As is clearly evident from the figure, the underside of the carrier TR is area-optimized and offers no space for a further contact area $CA_N$ at least in the predefined grid.

On the top side of the carrier TR, which naturally cannot be illustrated in the figure, the abovementioned MEMS capacitor microphone is provided as the electromechanical component, and an ASIC component is provided as the integrated circuit IC, said ASIC component having a region embodied as a programmable memory circuit.

FIG. 2 shows the plan of the underside of a microphone according to the invention. With in principle the same area division and available basic area of the carrier TR, here the first two contact areas $CA_S$ are split, such that here a total of five contact areas are available, four of them having a contact area approximately half the size of that as illustrated before and in FIG. 1. Here in each case two contact areas having a smaller basic area CAS fill the grid area or the space occupied by the larger contact area in the known microphone. However, the divided contact areas are electrically isolated from one another. The newly created smaller contact areas $CA_S$ are provided here for a program signal input W/R, which may also be a write/read access. A further newly created contact area is provided for the clock signal CLK.

A programming of the programmable memory unit, which may be an OTP component, is possible via the two split contact areas, that is to say the four contact areas having a reduced basic area. During the programming, the electrical connection to the now smaller contact areas can be performed by means of point contacts.

It is also possible, however, to clamp the microphone according to the invention, for inputting the adjustment value, into a suitable apparatus with spring contacts. After the contacting of all the contact areas, in the adjustment method according to the invention, operating parameters are determined, in particular the sensitivity of the microphone is determined. The contact areas VDD for supply voltages, GND for ground and OUT for signal output are used for this purpose. The ascertainment of the sensitivity can be carried out for different frequencies and for different signal strengths. Accordingly, the adjustment value can also constitute an extensive set of adjustment values which satisfy the different operating situations of the microphone.

Depending on how the readjustment of the operating parameter is performed with the aid of the adjustment value, the adjustment value is ascertained from the deviations from a setpoint value or from a setpoint value range. After programming the adjustment value into the programmable memory circuit, in which a read-only memory is written to, the microphone is disconnected from the contacts of the measuring and programming station and is now ready for use. The stored adjustment value is stored by the device over a relatively long period of many years and thus over the entire lifetime of the microphone, without an external power supply being required for this purpose.

FIG. 3 shows in schematic cross section a device BE mounted onto a circuit carrier PCB, said device being embodied here as a microphone. The device BE is mounted via soldering connections, for example solder bumps SB. In this case, the contact areas CA on the underside of the carrier TR are connected via soldering connections to corresponding connection areas KF on the top side of the circuit carrier PCB. Furthermore, the ring-shaped metallization MR on the underside of the carrier TR is connected to a likewise ring-shaped metallization on the top side of the circuit carrier PCB by means of a soldering ring SR. The mutual alignment of circuit carrier PCB and device BE is effected such that the sound opening SO in the carrier TR is centered above a corresponding sound hole in the circuit carrier. The sound channel then extends from below through the sound hole in the circuit carrier PCB through the ring-shaped seal SR, the sound opening SO in the carrier TR as far as the microphone EMC, which is illustrated here as an MEMS device with a membrane arranged at the bottom. The MEMS device is fixed on the top side of the carrier TR by means of a flip-chip design.

Between the contact areas on the underside of the carrier TR and the connection areas KF on the top side of the circuit carrier PCB, the electrical contact is produced via three soldering locations SB, which are embodied for example as solder bumps. Each soldering location here completely fills a grid area and here short-circuits in each case two divided or split contact areas $CA_S$. The device BE is connected via the three soldering locations, wherein a soldering location OUT serves for the signal output. In FIG. 3, the solder contact SB illustrated on the left is led through the small-area or split contact areas for GND and CLK in accordance with the sectional line AA in FIG. 2.

The construction of the microphone as illustrated in FIG. 3 furthermore shows the integrated circuit IC, which is mounted as a semiconductor component on the surface of the carrier, here for example likewise as a flip-chip arrangement. The integrated circuit IC in this case comprises the programmable memory unit, which here constitutes a part of the integrated circuit.

The electromechanical transducer EMC is fabricated from crystalline silicon, for example. Integrated circuit IC and electromechanical transducer EMC are preferably arranged adjacent and sealed with a common cover CV from above in relation to the carrier TR and thus also in relation to harmful environmental influences.

The cover CV may be a cover that bears conformally or is applied as at least one layer, which cover may also be configured in a multilayered fashion. Such a cover may comprise for example a flexible plastic film, which if appropriate is reinforced by means of an inorganic layer, in particular a metal layer. The metal layer can furthermore serve as electromagnetic shielding. However, the cover may also be a preformed rigid cover, for example a metal cap. It is also possible, however, for a trough-shaped depression to be formed on the carrier, the electromechanical transducer EMC being arranged within said depression. The trough may also be formed by a frame structure enclosing the electromechanical transducer EMC on the carrier. The cover may then close the trough like a lid and may be embodied in a planar fashion for this purpose.

Integrated circuit and electromechanical transducer EMC are electrically connected to one another, wherein the connection can be performed via an integrated interconnection within the carrier TR. It is also possible to interconnect integrated circuit and electromechanical transducer EMC via conductor tracks that are led on the surface of the carrier TR. A direct connection of the integrated interconnection and of the electromechanical transducer EMC by means of wires is also possible.

The volumes between electromechanical transducer EMC and carrier and also the volume between the integrated circuit IC and the carrier TR can be connected to one another. The volume above the membrane and the cover CV constitutes the back volume of the electromechanical transducer.

Besides an application of the invention for an MEMS microphone, the invention is suitable for further electromechanical sensors which, on account of their miniaturization, have an optimized footprint that can be reduced only with difficulty. Electromechanical components are affected in particular by manufacturing fluctuations, such that with the invention there is a simple possibility of readjusting fluctuations of the operating parameters that occur within a manufacturing batch, and thus of obtaining devices having uniform operating parameters or having only small manufacturing tolerances. According to the invention, this can be done without increasing the basic area of the devices and without altering the design for the user.

The invention is also not restricted to the embodiments illustrated in the figures. In particular, a device can comprise a larger number of contact areas; likewise, the contact areas can be distributed over a carrier differently than illustrated or have a different form.

It is also possible for exclusively contact areas to be provided on the underside of the carrier, wherein then in the case of a microphone, for example, a sound opening facing upward is provided, which no longer requires an opening in the carrier TR.

LIST OF REFERENCE SIGNS

BE Electric device
TR Carrier
OF1 First surface
    Grid having number of grid areas
$CA_{N,S}$ Contact areas
EMC Electromechanical component
IC Integrated circuit
SB Soldering locations
$CA_S$ Smaller-area contact areas, share a grid area
PCB Circuit carrier
SO Sound opening
CV Cover
RM Ring-shaped metallization for
SR Solder frame
KF Connection areas on PCB
M Membrane

The invention claimed is:
1. An electric device, comprising
  a carrier comprising a first surface having grid areas arranged in a grid,
  contact areas arranged in the grid areas,
  an electromechanical component, arranged in or on a second surface of the carrier,
  an integrated circuit,
  a programmable memory unit,
wherein
  the electromechanical component and the integrated circuit are electrically connected to one another and to the contact areas,
  the number of grid areas corresponds exactly to the number of those contact areas which are required for the proper function of the device,
  each of the grid areas corresponds to a soldering location that completely fills the grid area,
  at least one of the grid areas comprises two smaller contact areas that share a grid area,
  the smaller contact areas are arranged relative to one another in the shared grid area such that they are automatically short-circuited after the soldering of the device via the soldering location thereby rendering further influencing or programming of the programmable memory unit impossible after the smaller contact areas have been short-circuited without disturbing the proper function of the device,
  one of the smaller contact areas is configured to be used to carry out one-time programming (OTP) of the programmable memory unit,
  an other of the smaller contact areas is configured to be used to carry out the proper function of the device.

2. The device according to claim 1,
wherein the one of the smaller contact areas is connected to the programmable memory unit.

3. The device according to claim 2,
embodied as a microphone that supplies an analog output signal,
wherein the integrated circuit regulates the operation and the sensitivity of the microphone and also the strength of the output signal,
wherein the programmable memory unit makes available an adjustment value that can be set by the one-time programming, which adjustment value is forwarded to the integrated circuit in order to adapt at least one operating parameter in accordance with the adjustment value.

4. The device according to claim 1,
embodied as a microphone that supplies an analog output signal,
wherein the integrated circuit regulates the operation and the sensitivity of the microphone and also the strength of the output signal,
wherein the programmable memory unit makes available an adjustment value that can be set by the programming, which adjustment value is forwarded to the integrated circuit in order to adapt at least one operating parameter in accordance with the adjustment value.

5. The device according to claim 2,
wherein exactly three grid areas and thus three soldering locations are provided via which the device can be connected and via which the proper operation of the device is possible,
wherein contact areas for ground, supply voltage and for the signal output comprise in three different soldering locations,
wherein the contact areas for ground and supply voltage are smaller contact areas and share the grid area with in each case a smaller area contact area for a clock signal and a program signal input, which are connected to the programmable memory unit.

6. The device according to claim 4,
wherein exactly three grid areas and thus three soldering locations are provided via which the device can be connected and via which the proper operation of the device is possible,
wherein contact areas for ground, supply voltage and for the signal output comprise in three different soldering locations,
wherein the contact areas for ground and supply voltage are smaller contact areas and share the grid area with in each case a smaller area contact area for a clock signal and a program signal input, which are connected to the programmable memory unit.

7. The device according to claim 1, wherein the programmable memory unit is a flash memory.

8. The device according to claim 1, wherein all the soldering locations are approximately of identical size.

9. A method for adjusting devices comprising an electro-mechanical component, a control circuit and a programmable memory unit, comprising the steps of:
preparing finished produced devices,
determining at least one operating parameter for each of the prepared devices,
comparing the determined operating parameters with a predefined setpoint value or setpoint value range for identifying devices deviating therefrom,
determining a respective adjustment value for each deviating device,
inputting the respective adjustment value into the programmable memory unit via contact areas of the device to be adjusted,
wherein the adjustment value can adjust the control circuit of the device such that the deviating operating parameter(s) correspond(s) again to the setpoint value or the setpoint value range, and
wherein the devices are soldered after the adjustment value has been input into the programmable memory unit,
the soldering locations for each respective one of the devices are arranged in a grid,
each of the soldering locations fills a respective grid area,
two of the contact areas are smaller contact areas and share one of the soldering locations,
the two smaller contact areas are automatically short-circuited during the soldering thereby rendering further influencing or programming of the programmable memory unit impossible without disturbing proper functioning of the respective device,
one of the smaller contact areas is configured to be used to carry out one-time programming (OTP) of the electric device during which the respective adjustment value is inputted,
an other of the smaller contact areas is configured to be used to carry out the proper functioning of the respective device.

10. The method according to claim 9,
wherein all the soldering locations are approximately of identical size.

11. The method according to claim 10,
wherein the device is an analog miniaturized microphone with integrated amplifier, said microphone comprising a capacitor having variable capacitance as the electromechanical component,
wherein the sensitivity of the microphone is determined as the operating parameter,
wherein the adjustment value is provided for varying either the gain of an output signal of the microphone or a BIAS voltage applied to the capacitor of the microphone in order to adjust the sensitivity to the setpoint value or the setpoint value range.

12. The method according to claim 9,
wherein the device is an analog miniaturized microphone with integrated amplifier, said microphone comprising a capacitor having variable capacitance as the electromechanical component,
wherein the sensitivity of the microphone is determined as the operating parameter,
wherein the adjustment value is provided for varying either the gain of an output signal of the microphone or a BIAS voltage applied to the capacitor of the microphone in order to adjust the sensitivity to the setpoint value or the setpoint value range.

\* \* \* \* \*